United States Patent [19]

Sanemitsu

[11] Patent Number: 5,436,862
[45] Date of Patent: Jul. 25, 1995

[54] IC CARD INCLUDING MULTIPLE CONNECTORS PROVIDING MEMORY WRITE PRODUCTION

[75] Inventor: Yoshikado Sanemitsu, Itami, Japan

[73] Assignee: Mitsubishi Denki Kabushiki Kaisha, Tokyo, Japan

[21] Appl. No.: 215,693

[22] Filed: Mar. 22, 1994

[30] Foreign Application Priority Data

Mar. 23, 1993 [JP] Japan .................. 5-064244

[51] Int. Cl.6 .................................. G11C 7/00
[52] U.S. Cl. .................. 365/189.01; 365/195;
235/379; 235/380; 235/492
[58] Field of Search .......... 365/226, 189.01, 218,
365/195; 235/492, 380, 379

[56] References Cited

U.S. PATENT DOCUMENTS 5,267,218 11/1993 Elbert ................... 365/226

FOREIGN PATENT DOCUMENTS

| 0271290 | 11/1987 | Japan | 365/189.01 |
| 179161 | 5/1989 | Japan . | |
| 2255997 | 10/1990 | Japan . | |
| 364174 | 3/1991 | Japan . | |

Primary Examiner—Joseph A. Popek
Assistant Examiner—F. Niranjan
Attorney, Agent, or Firm—Leydig, Voit & Mayer

[57] ABSTRACT

An IC card for preventing undesirable writing and falsification of data, the IC card including a second connector for connecting a writing control signal line required to write data disposed on a second side of the IC card body opposite the first side of the IC card body on which a first connector is disposed. When the IC card is connected to the system only through the first connector, writing of data cannot be performed. When data is written, a writing control signal line is directly connected to a data writing control signal line of the second connector by a connection cable.

6 Claims, 6 Drawing Sheets

FIG. I

IC CARD INCLUDING MULTIPLE CONNECTORS PROVIDING MEMORY WRITE PRODUCTION

BACKGROUND OF THE INVENTION

FIELD OF THE INVENTION

This invention relates to an IC card for use as a portable data storage medium or the like connected to terminal equipment and more particularly to an IC card including a memory device in which data can be written.

DESCRIPTION OF THE RELATED ART

FIG. 6 is a block diagram which schematically illustrates the structure of a conventional IC card of the foregoing type and which shows a state where the IC card is connected to the system. Referring to FIG. 6, reference numeral 100 represents an IC card, 101 represents a card case, 1 represents a connector, 2 represents a nonvolatile semiconductor memory, 3 represents an address bus, 4 represents a data bus, 5 represents a card enable signal line (CE), 6 represents a reading control signal line (OE), 7 represents a writing control signal line (WE), 8 represents a power supply line (Vcc) and 9 represents a ground line (GND). The IC card 100 is supplied with power supply voltage (Vcc) from the system 200 connected thereto. Reference numerals 11 and 12 represent pull-up resistors for respectively raising the potentials of the card enable signal line 5 and the writing control signal line 7. It should be noted that the circuit shown in FIG. 6 has the simplest structure and a portion of circuits of the foregoing type includes an address decoder, a buffer and a control circuit including a portion for controlling the memory. Another type of the circuit includes different type memories.

Reference numeral 200 represents the system to which the IC card 100 is connected. Reference numeral 201 represents a connector of the system 200, 202 represents a micro-control unit (MCU), 203 represents an address bus, 204 represents a data bus, 205 represents a card enable signal line (CE), 206 represents a reading control signal line (OE), 207 represents a writing control signal line (WE), 208 represents a power supply line (Vcc) and 209 represents a ground line (GND). It should be noted that same functional signal lines and the same functional signals flowing through the signal lines are given the same symbols.

The operation of the IC card 100 will now be described. When the IC card is connected to the system 200 and the power supply voltage Vcc is supplied to the IC card 100, writing and reading of data are performed in response to the various control signals. The circuit shown in FIG. 6 is a negative logic circuit that makes the IC card non-operable when the level of the card enable signal line 5 is raised and that makes the card operable when the level of the card enable signal line 5 is lowered. When the level of the reading control signal line 6 is lowered and the level of the writing control signal line 7 is raised and the level of the chip enable signal line 5 is low, data can be read In this state, address data for the nonvolatile semiconductor memory 2 on the address bus 3 is read into the data bus 4, the read data being then transmitted to the system 200. When the level of the reading control signal line 6 is raised and the level of the writing control signal line 7 is lowered in a state where the IC card 100 is being operated, data can be written and data on the data bus 4 supplied from the system 200 is written in an address of the nonvolatile semiconductor memory 2 as instructed by the address bus 3.

Since the conventional IC card has been constituted as described above, there rises a problem in that writing of data can easily be performed, and accordingly there is a possibility that data can undesirably be written in the memory and a possibility that data can undesirably be rewritten. Another problem is, from the fact that writing of data can easily be performed, that falsification of data can easily be performed. In particular, a write enable nonvolatile semiconductor memory comprising an EEPROM and so forth stores data that is not required to be rewritten frequently as compared with a RAM and the like. A memory of the foregoing type may be arranged in such a manner that writing of data is usually inhibited, and then the foregoing structure involves no problem.

SUMMARY OF THE INVENTION

The present invention is directed to overcome the foregoing problems, and accordingly an object of the same is to provide an IC card structured in such a manner that undesirable writing of data can be prevented, and, furthermore falsification of data can be made difficult.

In order to achieve the foregoing object, according to a first aspect of the present invention, there is provided an IC card detachably connectable to a system, the IC card comprising: an IC card body having (a) an internal circuit including a nonvolatile semiconductor memory; (b) a card case accommodating the internal circuit; (c) a first connector disposed on a first side of the card case and connectable to the system for connecting data, address and a variety of control signals; and (d) a second connector disposed on a second side of the card case for connecting some of the signals required to write data into the nonvolatile semiconductor memory; and detachable writing signal external connection means disposed separately from the IC card body for establishing a connection between the system and the second connector and for connecting the signals required to write data and supplied from the system to the second connector when data is written in the nonvolatile semiconductor memory.

According to a second aspect of the present invention, there is provided an IC card detachably connectable to a system, the IC card comprising: an IC card body having (a) an internal circuit including a nonvolatile semiconductor memory; (b) a card case accommodating the internal circuit; (c) a first connector disposed on a first side of the card case and connectable to the system for connecting signals; (d) a second connector disposed on a second side of the card case, for connecting some of the signals required to write data into the nonvolatile semiconductor memory; and (e) signal internal connection means for directly connecting some portion of the signals from the first connector, and supplied from the system, and required to write data to the second connector, and a detachable signal connector separate from the IC card body and connectable to the second connector when data is written into the nonvolatile semiconductor memory for connecting the signals transferred from the writing signal internal connection means to the nonvolatile semiconductor memory.

According to a third aspect of the present invention, there is provided an IC card detachably connectable to a system, the IC card comprising: an IC card body having (a) an internal circuit including a nonvolatile semiconductor memory; (b) a card case accommodating the internal circuit; (c) a first connector disposed on a first side of the card case for connecting to the system to connect signals; (d) a second connector disposed on a second side of the card case, for connecting some of the signals required to write data into said nonvolatile semiconductor memory; and (e) signal conversion/connection means for, in a predetermined manner and in the internal circuit, converting signals from the first connector and supplied from the system that is required to write data, the converted signal being connected to the second connector, and a detachable writing signal inversely-converting/connecting connector separate from the IC card body for connection to the second connector when data is written into the nonvolatile semiconductor memory to inversely convert the converted signal transferred from the writing signal conversion/connection means for connecting the inversely converted signal to the nonvolatile semiconductor memory.

The IC card according to the first aspect of the present invention is arranged in such a manner that the second connector for connecting a portion of signals required to write data is separate from the ordinary first connector is disposed on the second side different from the first side on which the first connector is disposed, and the portion of the signals required to write data is connected through the second connector. As a result, writing of data cannot usually be performed when the IC card body is connected to the system through the first connector. When writing data, the writing signal external connection means, such as a cable, disposed separately from the IC card body is used to establish the direct connection of the portion of the signals and supplied from the system through the second connector. As a result, only reading of data is performed in a usual state where the IC card body is connected to the system through the first connector. Therefore, undesirable writing or rewriting of data can be prevented and falsification of data cannot be performed.

The IC card according to the second aspect of the present invention includes the first connector and second connector, similar to the structure according to the first aspect, and a portion of the signals required to write data is connected from the system to the second connector through the first connector and the writing signal internal connection means in the IC card. However, the internal connection means and the signal line required to write data into the nonvolatile semiconductor memory are not connected to each other in the second connector. Therefore, in the usual operational state where the IC card body is connected to the system through the first connector, data is only read similarly to the structure according to the first aspect. Therefore, undesirable writing of data can be prevented. When writing of data is performed, the writing signal connector having the connection loop for establishing the connection between the internal connection means and the signal line for the signal required to write data into the nonvolatile semiconductor memory, which are respectively connected to the second connector, is connected to the second connector.

The IC card according to the third aspect of the present invention has a structure which is an improvement of the IC card according to the second aspect, and in which the writing signal conversion/connection means performing a predetermined conversion is used to establish the connection of between the first connector and the second connector. When data is written, the conversion/internal-connection means and the signal line for the signals required to write data on the nonvolatile semiconductor memory, which are respectively connected to the second connector, are connected to each other. Further, the writing signal inversely-converting/connecting connector performing inverse conversion to restore the converted signal to the original state is connected to the second connector. As a result, writing cannot be performed if the conversion performed by the writing signal conversion/connection means in the card and the inverse conversion performed by the writing signal inversely-converting/connecting connector connected to the second connector do not coincide with each other. Thus, falsification is made further difficult.

DESCRIPTION OF THE PREFERRED EMBODIMENTS

First Embodiment

Figure 1:
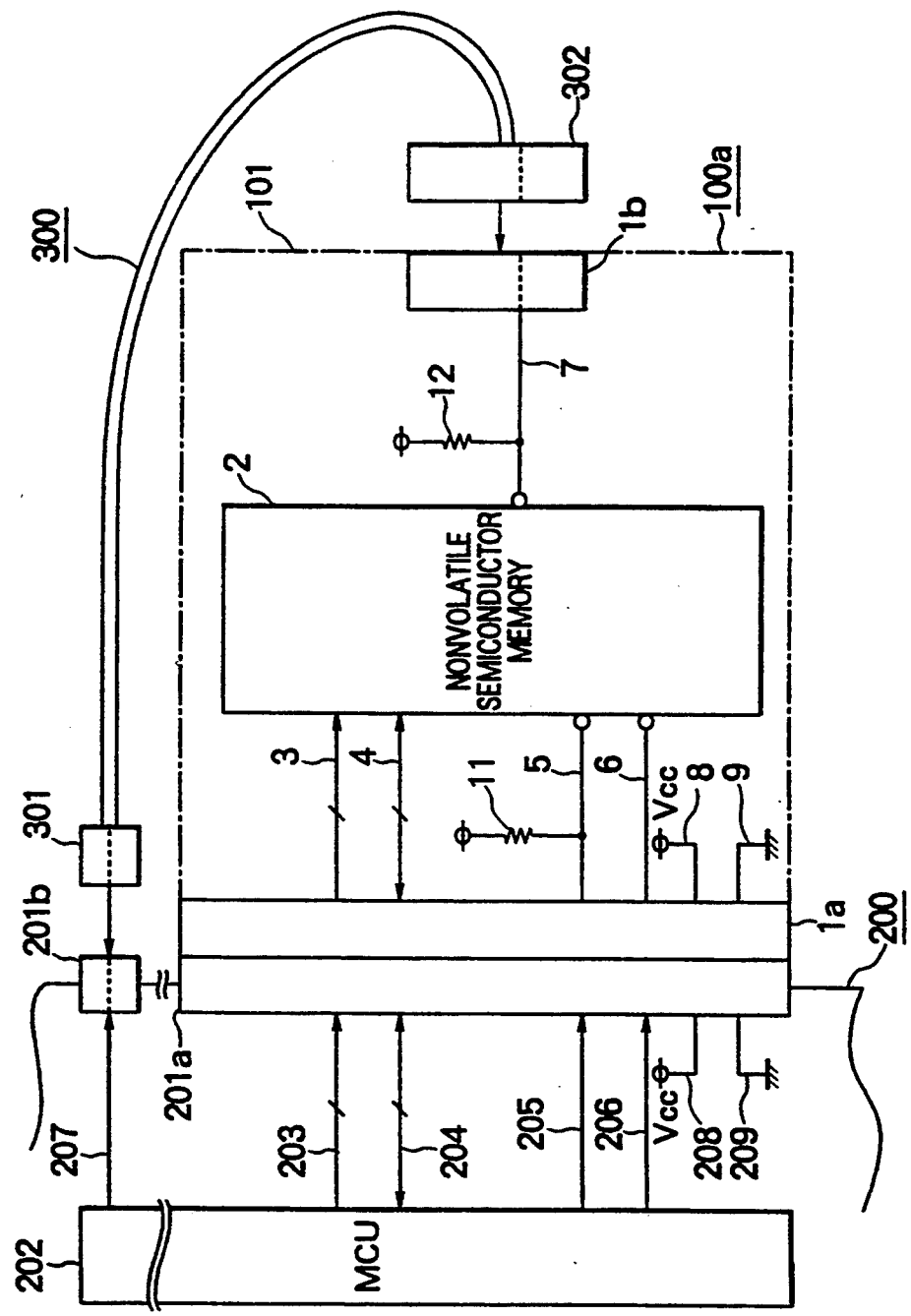
FIG. 1 is a block diagram which illustrates the structure of an IC card according to a first embodiment of the present invention.

An embodiment of the present invention will now be described. FIG. 1 is a block diagram which schematically illustrates the structure of an IC card according to an embodiment of the present invention and which shows a state where the IC card is connected to the system. Referring to FIG. 1, the portions given the same reference numerals as those of the conventional IC card represent corresponding portions and their descriptions are omitted. Reference numeral 100a represents an IC card body of the IC card according to the present invention, the IC card body 100a having a first connector 1a and a second connector 1b disposed opposite the first connector 1a. The signal lines, except the writing control signal line 7, are connected to the first connector 1a, while the writing control signal line 7 is connected to the second connector 1b. The IC card according to the present invention comprises the IC card body 100a and a connection cable 300 to be described later and disposed separately from the IC card body 100a.

Reference numeral 200 represents the system, 201a represents a system-side connector and 201b represents a sub-connector. The IC card body 100a (hereinafter simply called an "IC card) is connected to the system-side connector 201a through the first connector 1a. A third connector 301 to be described later is connected to the sub-connector 201b. Reference numeral 300 represents a detachable connection cable for establishing the connection between the writing control signal line 207 of the system 200 and the writing control signal line 7 of the IC card 100a at the time of writing data on the IC card 100a. The connection cable 300 has, at an end thereof, a third connector 301 to be connected to the sub-connector 201b of the system 200, the connector cable 300 has, at the other end thereof, a fourth connector 302 to be connected to the second connector 1b of the IC card 100a. Each of the second connector 1b of the IC card 100a and the fourth connector 302 of the connection cable 300 has connection pins (omitted from illustration) in a portion thereof that must be connected.

This embodiment is arranged in such a manner that the internal circuit comprises a nonvolatile semiconductor memory 2, while the writing signal external connection means comprises the connection cable 300. As the signal required to write data and connected to the second connector, a writing control signal is selected.

Operation will now be described. When the IC card 100a is connected to the system 200 through the first connector 1a and the power supply voltage is applied to the IC card 100a, only the reading operation is enabled. When the level of the card enable signal line 5 has been lowered due to the control performed by the system 200, the IC card 100a is brought into an operable state. When the level of the reading control signal line 6 has been lowered afterwards, data for an address of the nonvolatile semiconductor memory 2 specified on the address bus 3 is read onto the data bus 4 so that data is transmitted to the system 200. Since the writing control signal line 7 cannot be controlled in the foregoing state, writing (rewriting) of data cannot be performed.

If data is intended to be written on the IC card 100a, there must be a connection, through the connection cable 300, connected between the writing control signal line 207 of the system 200 and the writing control signal line 7 of the IC card 100a. In this case, the third connector 301 disposed at the end of the cable 300 is connected to the sub-connector 201b of the system 200, while the fourth connector 302 disposed at the other end is connected to the second connector 1b of the IC card 100a, the connection being established as illustrated. When the control of the system 200 has lowered the level of the card enable signal line 5, raised that of the reading control signal line 6 and lowered that of the writing control signal line 7, data on the data bus 4 is written into the address of the nonvolatile semiconductor memory 2 instructed by the address bus 3. When the level of the card enable signal line 5 has been raised, the IC card 100a is made non-operable regardless of whether the connection cable 300 is connected.

As described above, the IC card according to this embodiment only permits reading of data when the IC card body is simply connected to the system. In this state, an individual connection cable must be connected to write data. Therefore, undesirable writing or rewriting of data can be prevented. Moreover, easy falsification of data is inhibited.

Although the second connector 1b of the IC card 100a is disposed on the side opposing the first connector 1a, the present invention is not limited to this arrangement. The second disposed on connector may be different from the side on which the first first connector is disposed.

Second Embodiment

Figure 2:
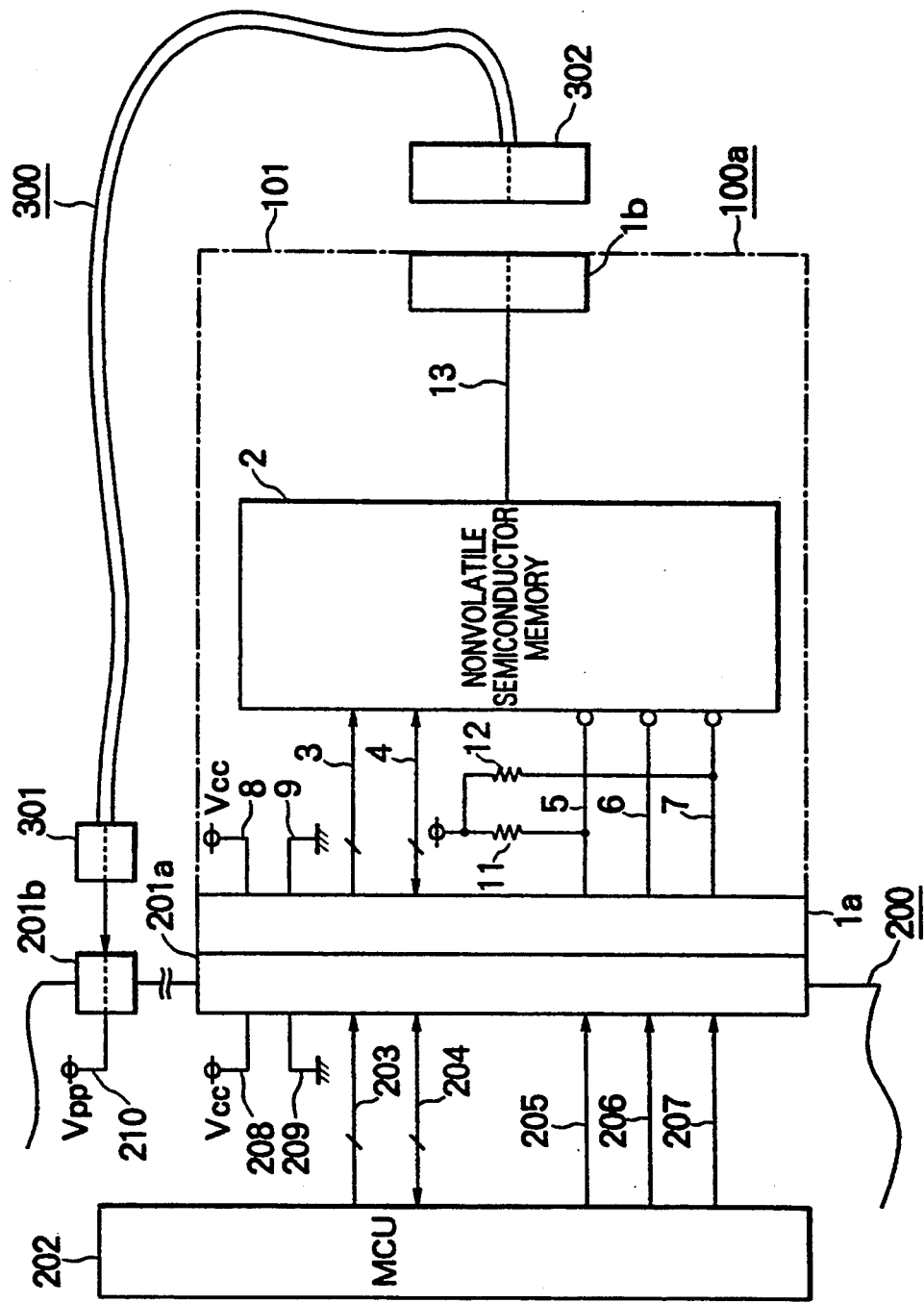
FIG. 2 is a block diagram which illustrates the structure of an IC card according to a second embodiment of the present invention.

Although the first embodiment is arranged in such a manner that the writing control signal is selected as the signal required to write data and is connected through the second connector of the IC card, any signal may be employed if it has the portion of the signal required to write data. FIG. 2 illustrates another embodiment arranged in such a way that an IC card comprising the nonvolatile semiconductor memory 2, which requires a high voltage at the time of writing data, is supplied with the high power supply voltage Vpp through the second connector, the high power supply voltage Vpp being the voltage required to write data. FIG. 2 illustrates the IC card according to this embodiment connected to the system. This embodiment is different from the embodiment shown in FIG. 1 in that the writing control signal line 7 of the IC card 100a is connected to the writing control signal line 207 of the system 200 through the first connector 1a and that the connection cable 300 establishes the connection between a high voltage power supply line 210 (Vpp) and a high voltage power supply line 13 of the IC card 100a in order to write data on the system 200. Also, the foregoing structure is able to inhibit data writing if the connection cable 300 is not connected, and therefore a similar effect can be obtained.

Third Embodiment

Figure 3:
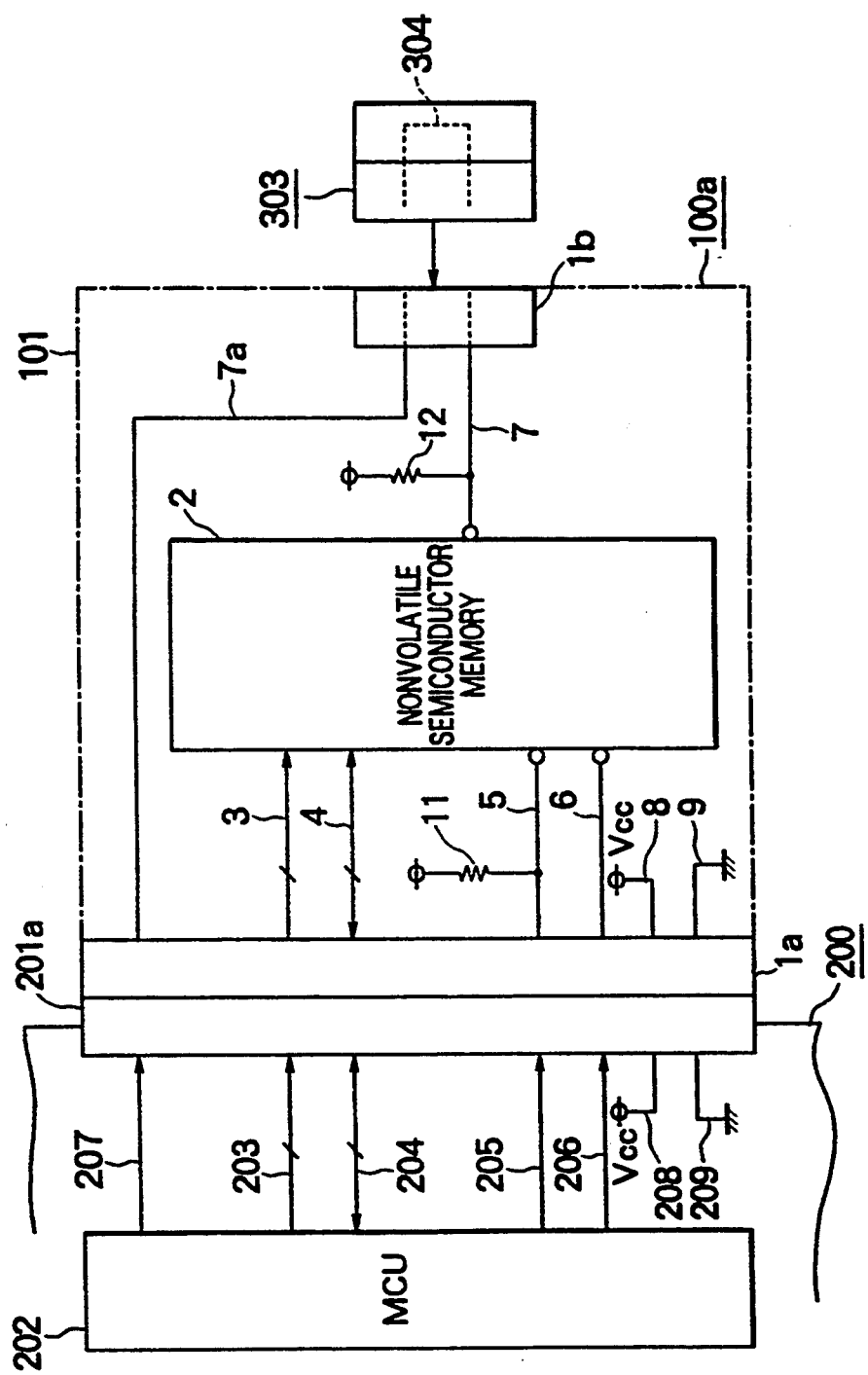
FIG. 3 is a block diagram which illustrates the structure of an IC card according to a third embodiment of the present invention.

FIG. 3 is a block diagram which schematically illustrates the structure of an IC card according to an embodiment of the present invention and which shows the IC card connected to the system. The IC card 100a according to this embodiment includes a writing control signal connection line 7a connected between the first connector 1a and the second connector 1b. The writing control signal connection line 7a and the writing control signal line 7, through which data is written into the nonvolatile semiconductor memory 2, are individually connected to the second connector 1b. Reference numeral 303 represents a writing signal connector having a connection loop 304 designated by a dashed line. The writing signal connector 303 is connected to the second connector 1b of the IC card 100a at the time of writing data. As a result, the writing control signal connection line 7a and the writing connection signal line 7 are connected by the connection loop 304 so that writing of data is enabled.

This embodiment is arranged in such a manner that the writing signal internal connection means comprises the writing control signal connection line 7a, and the writing signal connector comprises the connector 303. The IC card according to the aspect of the present invention comprises the IC card (body) 100a and the writing signal connector 303.

Then, the operation will now be described. When the IC card 100a is connected to the system 200 through the first connector 1a and the power supply voltage is supplied to the system 200, only the reading operation can be performed. When the level of the card enable signal line 5 has been lowered by the system 200, the IC card 100a is brought to the operable state. When the level of the reading control signal line 6 has been lowered afterwards, data for an address of the nonvolatile semiconductor memory 2 specified on the address bus 3 is read onto the data bus 4, read data being then transmitted to the system 200. In the foregoing state, transmission of the writing control signal is stopped at the second connector 1b of the IC card 100a through the writing control signal line 207 and the writing control signal connection line 7a. Therefore, writing (rewriting) of data cannot be performed.

If writing of data into the IC card 100a is intended, the writing signal connector 303 is connected to the second connector 1b stored in a predetermined place or held by a user of the IC card 100a. As a result, the write control signal is supplied to the nonvolatile semiconductor memory 2 through the signal line 207, the connection line 7a, the connection loop 304 of the connector 303 and the signal line 7. When the system 200 has lowered the level of the card enable signal line 5, raised that of the reading control signal line 6 and lowered that of the writing control signal line 7, data on the data bus 4 is written into the address of the nonvolatile semiconductor memory 2 specified on the address bus 3. Also in this embodiment, the second side, on which the second connector 1b of the IC card 100a is disposed is not limited to a side opposing the first side on which the first connector 1a is disposed.

Fourth Embodiment

Although each of the foregoing embodiments includes a nonvolatile semiconductor memory as the internal circuit, an IC card according to this embodiment includes other semiconductor devices (circuits).

Figure 4:
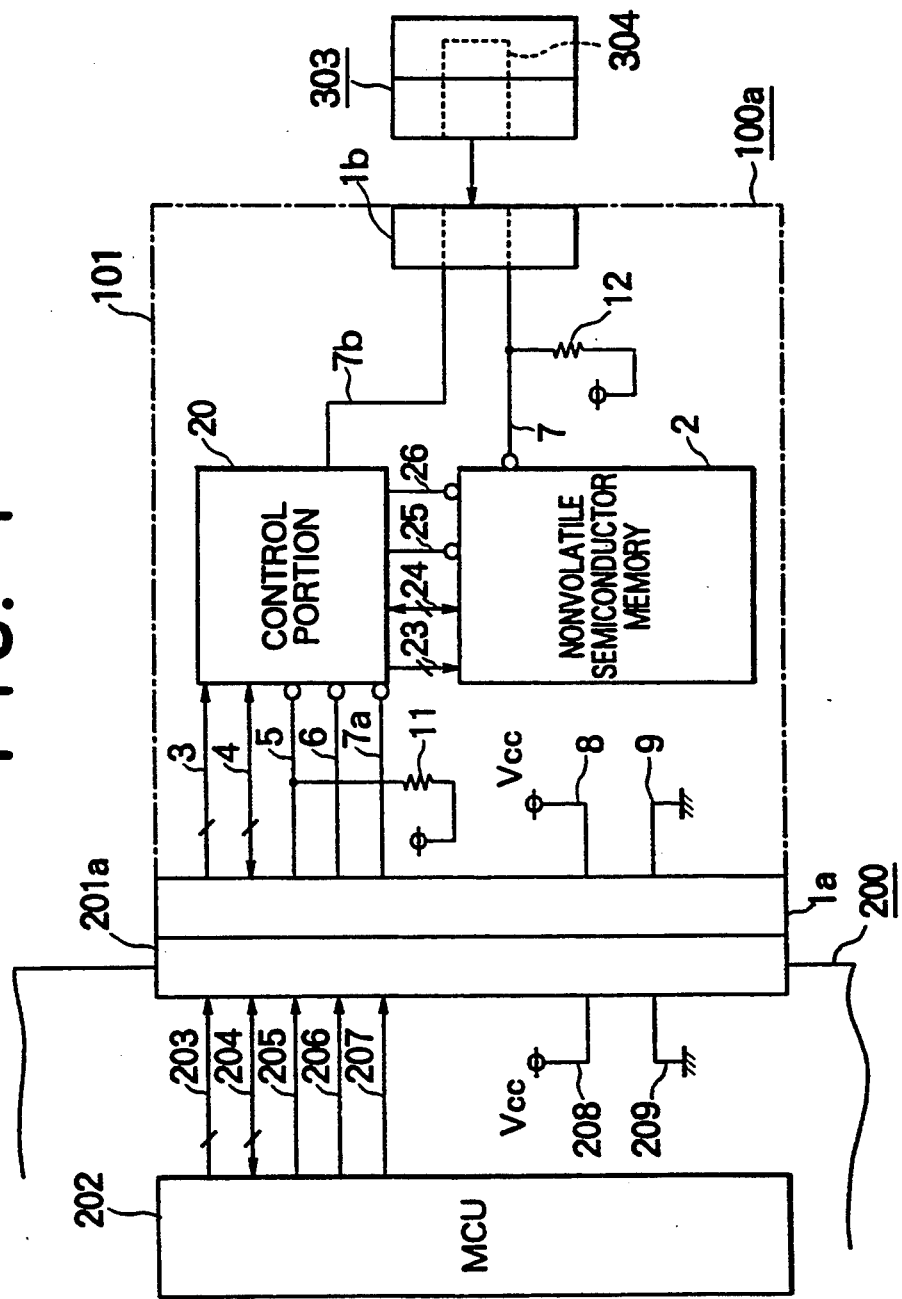
FIG. 4 is a block diagram which illustrates the structure of an IC card according to a fourth embodiment of the present invention.

FIG. 4 is a block diagram which schematically illustrates the structure of the IC card according to another embodiment of the present invention and which shows a state where the IC card is connected to the system. The IC card 100a according to this embodiment comprises a control portion 20 in addition to the nonvolatile semiconductor memory 2. The control portion 20 comprises peripheral circuits, such as a control device for controlling the memory 2, buffer circuits adapted to various signals, and an address decoder circuit for decoding the address signal (respectively omitted from illustration) (for example, DP83902 manufactured by National Semiconductor is employed as the control device, and the buffer circuits and the address decoder circuit are formed by gate arrays). Since the detailed internal structure of the control portion 20 is not particularly related to the present invention, its description is omitted here. That is, no particular limitation exists about the internal structure of the control portion 20. The IC card may include other circuits (For example, another type memory).

The IC card 100a according to this embodiment is arranged in such a manner that the address bus 3, the data bus 4, the card enable signal line 5, the reading control signal line 6 and the writing control signal connection line 7a are connected to the control portion 20 through the first connector 1a. As the outputs from the control portion 20, an address bus 23, a data bus 24, a chip enable signal line 25 and a reading control signal line 26 are connected to the memory 2. A writing control signal connection line 7b extending from the control portion 20 is connected to the second connector 1b disposed opposite the first connector 1a. Also the writing control signal connection line 7 to be connected to the memory 2 is connected to the second connector 1b. That is, the basic structure is the same as that of the third embodiment except for the employment of the control portion 20.

This embodiment comprises a writing signal internal connection means comprising the writing control signal connection lines 7a, 7b and a portion of the control portion 20. The IC card according to the aspect of the present invention comprises the IC card (body) 100a and the writing signal connector 303.

The operation of this embodiment will now be described. The control portion 20 receives a signal from the system 200 through the address bus 3, the data bus 4, the card enable signal line 5, the reading control signal line 6 and the writing control signal connection line 7a so as to perform a predetermined process. The signals except the writing control signal are, through the address bus 23, the data bus 24, the chip enable signal line 25 and the reading control signal line 26, supplied to the nonvolatile semiconductor memory 2. The writing control signal is, through the writing control signal connection line 7b, connected to the second connector 1b. Therefore, the writing control signal cannot be supplied to the nonvolatile semiconductor memory 2 if the writing signal connector 303 is not connected to the second connector 1b. In this state, data writing cannot be performed.

Also in the foregoing third and fourth embodiments, the signal required to be supplied through the second connector 1b is not limited to the writing control signal.

Fifth Embodiment

Figure 5:
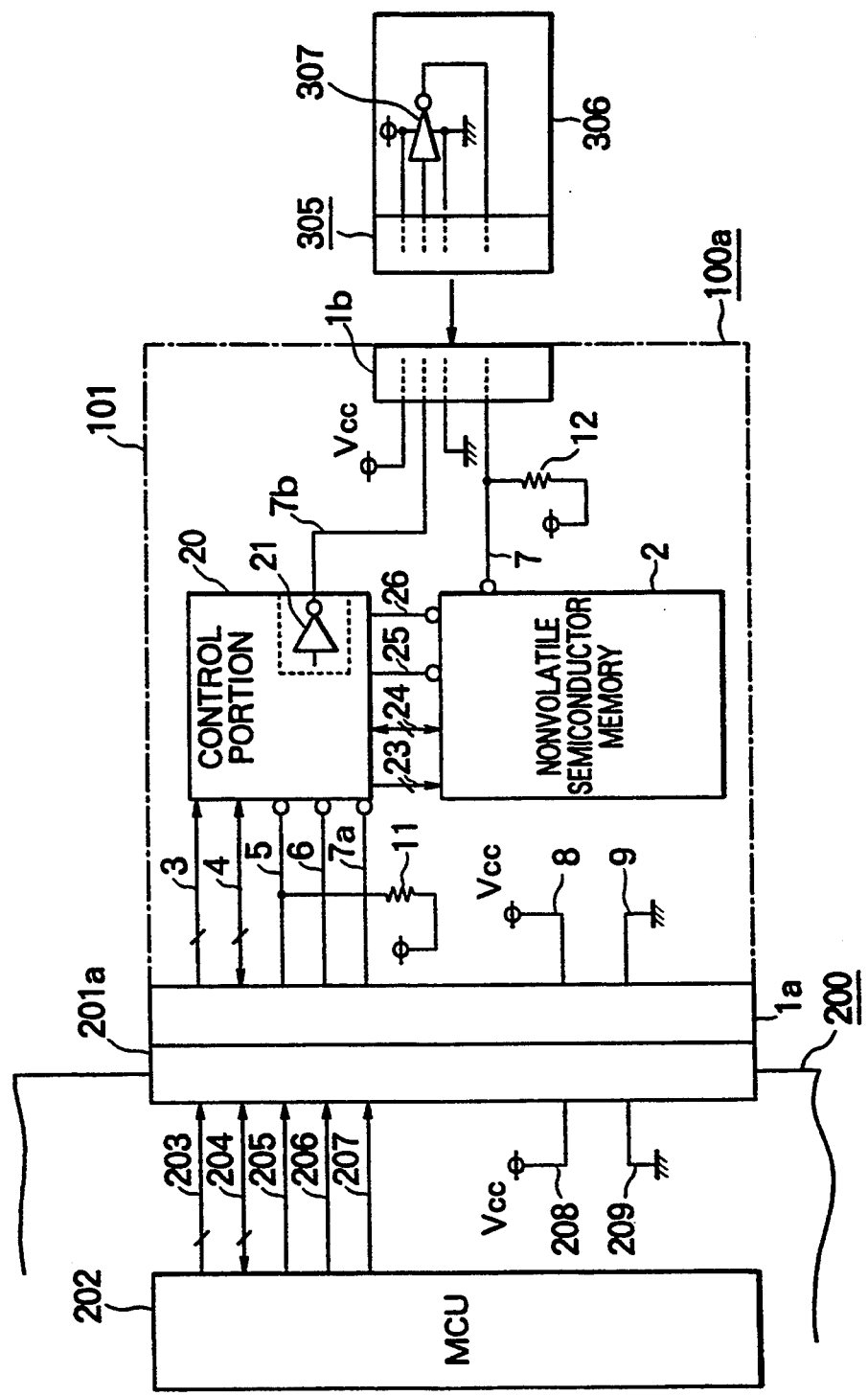
FIG. 5 is a block diagram which illustrates the structure of an IC card according to a fifth embodiment of the present invention.
Figure 6:
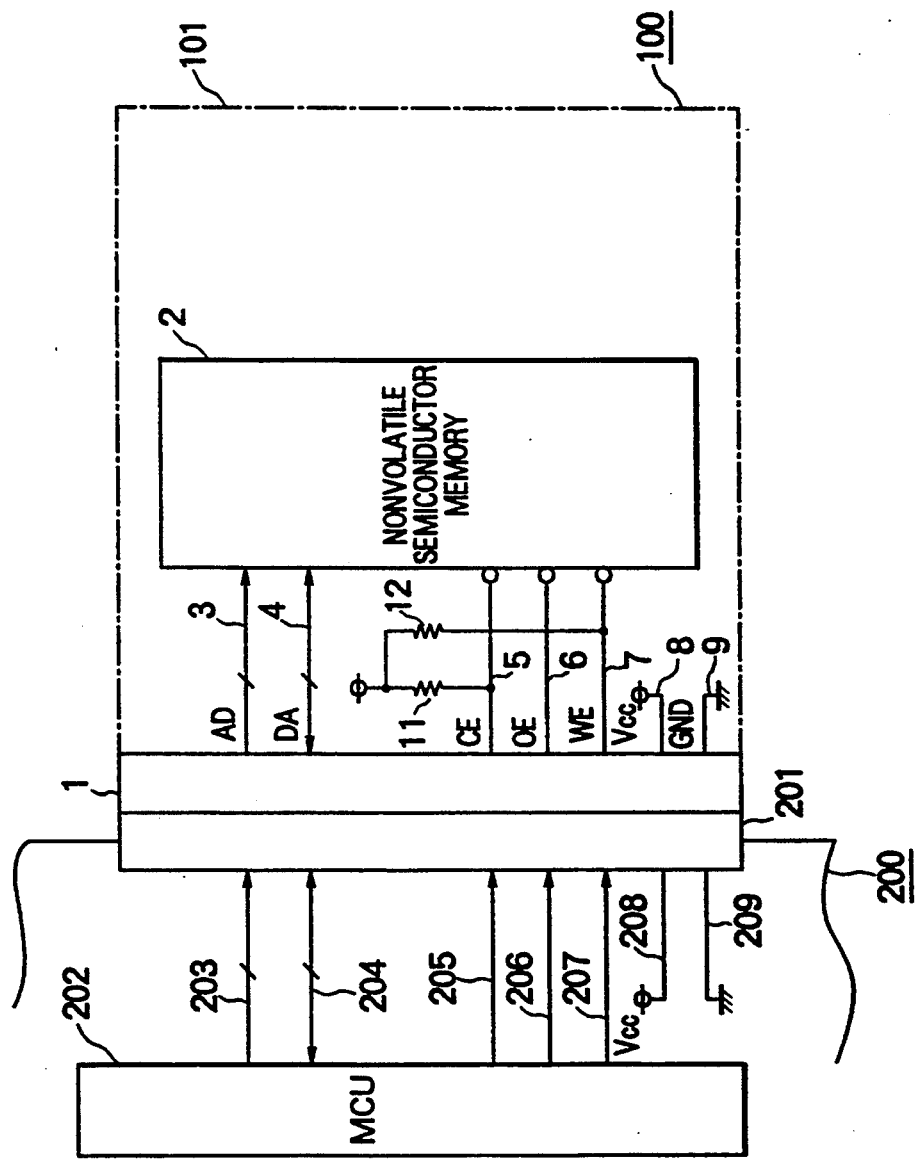
FIG. 6 is a block diagram which illustrates the structure of a conventional IC card.

FIG. 5 is a block diagram which schematically illustrates the structure of an IC card according to an embodiment of the present invention and which shows a state where the IC card is connected to the system. This embodiment is a development of the IC card according to the fourth embodiment in which the writing control signal is converted in a predetermined manner in an internal circuit of the IC card 100a, the converted signal being then inversely converted through a connector 305 connected to the second connector 1b and supplied to the memory 2. Therefore, a desired signal cannot be obtained if the connector 305 for performing a corresponding inverse conversion is not connected to a predetermined IC card 100a.

The IC card 100a shown in FIG. 5 is different from that shown in FIG. 4 in that an inverter 21 is disposed in an output portion of the control portion 20 connected to the writing control signal connection line 7b. When data is written, a connector 305 having a circuit block is connected to the second connector 1b of the IC card 100a. The connector 305 comprises a circuit block 306 which includes an inverter 307.

In this embodiment, a writing signal conversion/connection means comprises the writing control signal connection lines 7a and 7b and a portion of the control portion 20 including the inverter 21. A writing signal inversely conversion/connection connector comprises the connector 305 having the circuit block. The IC card according to the aspect of the present invention comprises the IC card (body) 100a and the connector 305 having the circuit block.

The operation will now be described. The operation to be performed in the state where data can be read is the same as that performed in the fourth embodiment, and therefore its description is omitted here. When data is written, the connector 305 is connected to the second connector 1b of the IC card 100a. As a result, the writing control signal to be transmitted from the control portion 20 to the writing control signal connection line 7b is inverted by the inverter 21 of the control portion 20, the inverted signal being then again inverted by the inverter 307 of the control connector 305. Therefore, a writing control signal having a desired level can be supplied to the memory 2 so that writing can be performed. That is, the circuit of the circuit block 306 of the control connector 305 must be a circuit for inversely converting the conversion performed in the internal circuit in the IC card 100a to write data. As a result, the connector 305 having the predetermined circuit block 306 must be connected to a predetermined IC card 100a to write data. Therefore, undesirable writing of data can be prevented, and unauthorized data falsification can be prevented.

Although the foregoing embodiment is arranged in such a manner that the means for converting the signal required to write data comprises the inverter for inverting the signal, the present invention is not limited to this. Any conversion means may be employed if it causes a predetermined conversion to be performed in the internal circuit of the IC card and causes the inverse conversion of the foregoing to be performed in the connector to restore the original state of the signal so as to obtain a signal having a desired level.

As described above, the IC card according to the first aspect of the present invention is arranged in such a manner that the second connector for connecting a portion of signals required to write data is, separately from the ordinary first connector, disposed on a second side different from the first side on which the first connector is disposed and the signals required to write data are connected through the second connector so that writing of data cannot usually be performed when the IC card body is connected to the system through the first connector. When writing of data is performed, the individual connection cable is used to establish the direct connection of the signals required to perform writing between the system and the second connector. As a result, data can be written only when the connection cable separate from the IC card body is connected between the system and the IC card. Therefore, undesirable writing or rewriting of data can be prevented. By storing the connection cable in a predetermined place or by giving the user of the IC card the connection cable, the falsification of data cannot easily be performed. As a result, an effect can be obtained in that a more reliable IC card can be provided.

The IC card according to the second aspect of the present invention is arranged in such a manner that the first connector and the second connector are, similar to the structure according to the first aspect, provided and a portion of the signals required to write data is connected from the system to the second connector through the first connector and the signal connection line in the IC card. When data is written, the writing signal connector is connected to the second connector, the writing signal connector having the connection loop for establishing the connection between the signal connection line and the signal line for the signal required to write data on the nonvolatile semiconductor memory, each of which is connected to the second connector. Therefore, writing of data requires an operation for connecting the writing signal connector separate from the IC card to the second connector. As a result, undesirable writing or rewriting of data can be prevented. By storing the connector in a predetermined place or by giving the user of the IC card the connection cable, the falsification of data cannot easily be performed. As a result, an effect can be obtained in that a more reliable IC card can be provided.

The IC card according to the third aspect of the present invention has a structure, which is an improvement of the IC card according to the second aspect, and in which the signal connection line disposed in the card and performing a predetermined conversion is used to establish the connection of a portion of the signals required to write data from the first connector to the second connector. When data is written, the signal connection line and the signal line required to write a signal on the nonvolatile semiconductor memory, each of which is connected to the second connector, are connected to each other. Further, a connector having the circuit block for performing the inverse conversion which restores the conversion signal to the original state, is connected to the second connector. Therefore, writing cannot be performed if the conversion of the signal performed in the card and the inverse conversion performed in the connector do not coincide with each other. As a result, undesirable writing of data can be prevented, and the falsification of data cannot easily be performed. As a result, an effect can be obtained in that a more reliable IC card can be provided.

What is claimed is:

1. An IC card detachably connectable to a system, said IC card comprising:
   an IC card body having
      (a) an internal circuit including a nonvolatile semiconductor memory requiring a plurality of input signals for writing data into said nonvolatile semiconductor memory;
      (b) a card case accommodating said internal circuit;
      (c) a first connector disposed on a first side of said card case connectable to said system to connect data, address, and control signals; and
      (d) a second connector disposed on a second side of said card case different from said first side for connecting some of the signals required to write data into said nonvolatile semiconductor memory to said nonvolatile semiconductor memory; and
   detachable writing signal external connection means separate from said IC card body for establishing a connection between said system and second connector and connecting some of the signals required to write data and supplied from said system to said second connector to write into said nonvolatile semiconductor memory.

2. An IC card detachably connectable to a system, said IC card comprising:
   an IC card body having
      (a) an internal circuit including a nonvolatile semiconductor memory requiring a plurality of input signals for writing data into said nonvolatile semiconductor memory;
      (b) a card case accommodating said internal circuit;
      (c) a first connector disposed on a first side of said card case connectable to said system to connect various signals; and
      (d) a second connector disposed on a second side of said card case different from said first side for connecting some of the signals required to write data into said nonvolatile semiconductor memory to said nonvolatile semiconductor memory; and
      (e) internal signal connection means for directly connecting some of the signals from said first connector and supplied from said system and required to write data to said second connector; and
   a detachable signal connector separate from said IC card body for connection to said second connector to write data into said nonvolatile semiconductor memory to connect the signal transferred from the internal signal connection means to said nonvolatile semiconductor memory.

3. An IC card detachably connectable to a system, said IC card comprising:
   an IC card body having (a) an internal circuit including a nonvolatile semiconductor memory requiring a plurality of input signals for writing data into said nonvolatile semiconductor memory;

(b) a card case accommodating said internal circuit;

(c) a first connector disposed on a first side of said card case connectable to said system to connect various signals; and (d) a second connector disposed on a second side of said card case different from said first side for connecting some of the signals required to write data into said nonvolatile semiconductor memory to said nonvolatile semiconductor memory; and (e) signal conversion/connection means for, in said internal circuit, converting some of the signals transmitted through said first connector and supplied from said system required to write data and supplied to said second connector as a converted signal; and a detachable writing signal inversely-converting-/connecting connector separate from said IC card body and connectable to said second connector to write data into said nonvolatile semiconductor memory for inversely converting the converted signal transferred from said writing signal conversion/connection means and for connecting the inversely converted signal to said nonvolatile semiconductor memory.

4. The IC card of claim 1 wherein the first and second connectors are both electrical connectors.

5. The IC card of claim 2 wherein the first and second connectors are both electrical connectors.

6. The IC card of claim 3 wherein the first and second connectors are both electrical connectors.

* * * * *

UNITED STATES PATENT AND TRADEMARK OFFICE
CERTIFICATE OF CORRECTION

PATENT NO. : 5,436,862
DATED : July 25, 1995
INVENTOR(S) : Sanemitsu

It is certified that error appears in the above-indentified patent and that said Letters Patent is hereby corrected as shown below:

Column 10, Line 36, after "write" insert --data--.

Signed and Sealed this

Ninth Day of January, 1996

Attest:

BRUCE LEHMAN

Attesting Officer

Commissioner of Patents and Trademarks